(12) United States Patent
Huguenin et al.

(10) Patent No.: US 8,912,067 B2
(45) Date of Patent: Dec. 16, 2014

(54) METHOD FOR MANUFACTURING MOS TRANSISTORS WITH DIFFERENT TYPES OF GATE STACKS

(75) Inventors: Jean-Luc Huguenin, Grenoble (FR); Grégory Bidal, Grenoble (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 13/237,738

(22) Filed: Sep. 20, 2011

(65) Prior Publication Data
US 2012/0083110 A1 Apr. 5, 2012

(30) Foreign Application Priority Data
Oct. 4, 2010 (FR) .................................... 10 58024

(51) Int. Cl.
H01L 21/8234 (2006.01)
H01L 29/51 (2006.01)
H01L 29/49 (2006.01)
H01L 21/28 (2006.01)

(52) U.S. Cl.
CPC ........ *H01L 21/823462* (2013.01); *H01L 29/51* (2013.01); *H01L 21/82345* (2013.01); *H01L 29/513* (2013.01); *H01L 29/4966* (2013.01); *H01L 21/28088* (2013.01)
USPC ..... 438/275; 438/199; 438/261; 257/E21.632

(58) Field of Classification Search
USPC .......................... 438/275, 199, 216, 261, 591; 257/E21.632
See application file for complete search history.

(56) References Cited

U.S. PATENT DOCUMENTS

| | | | |
|---|---|---|---|
| 2005/0035345 A1 | 2/2005 | Lin et al. | |
| 2007/0032021 A1* | 2/2007 | Park | 438/275 |
| 2008/0070367 A1 | 3/2008 | Pae et al. | |
| 2009/0283838 A1 | 11/2009 | Park et al. | |
| 2010/0044806 A1* | 2/2010 | Hou et al. | 257/412 |
| 2010/0048010 A1 | 2/2010 | Chen et al. | |
| 2010/0320547 A1* | 12/2010 | Ando et al. | 257/411 |
| 2011/0073964 A1* | 3/2011 | Chowdhury et al. | 257/411 |
| 2011/0291198 A1* | 12/2011 | Ando et al. | 257/368 |

OTHER PUBLICATIONS

Choi "Scaling equivalent oxide thickness with flat band voltage (VFB) modulation using in situ Ti and Hf interposed in a metal/high-k gate stack." J of Appl. Physics 108, 064107 (2010).
French Search Report dated Mar. 31, 2011 from corresponding French Application No. 10/58024.
Written Opinion dated Mar. 31, 2011from corresponding French Application No. 10/58024.

* cited by examiner

*Primary Examiner* — Thanhha Pham
(74) *Attorney, Agent, or Firm* — Gardere Wynne Sewell LLP

(57) ABSTRACT

A method for manufacturing three types of MOS transistors in three regions of a same substrate, including the steps of: forming a first insulating layer, removing the first insulating layer from the first and second regions, forming a silicon oxide layer, depositing an insulating layer having a dielectric constant which is at least twice greater than that of silicon oxide, depositing a first conductive oxygen scavenging layer, removing the first conductive layer from the second and third regions, and annealing.

13 Claims, 3 Drawing Sheets

METHOD FOR MANUFACTURING MOS TRANSISTORS WITH DIFFERENT TYPES OF GATE STACKS

CROSS REFERENCE TO RELATED APPLICATIONS

This application claims the priority benefit of French patent application number 10/58024, filed on Oct. 4, 2010, entitled "METHOD FOR MANUFACTURING MOS TRANSISTORS WITH DIFFERENT TYPES OF GATE STACK," which is hereby incorporated by reference to the maximum extent allowable by law.

BACKGROUND OF THE INVENTION

1. Field of the Invention

The present invention relates to a method for manufacturing MOS transistors.

2. Discussion of the Related Art

MOS transistors have speed, power consumption, and power characteristics which depend, among others, on the gate insulator thickness. In many cases, three types of MOS transistors having different gate insulator thicknesses are desired to be formed on the same chip. For example, if the transistor should stand high voltages (in the general case of power transistors), the gate insulator thickness should be large. If the transistor should be the fastest possible, all its dimensions, and especially its gate insulator thickness, should be as small as possible, but this generally causes the existence of non-negligible leakage currents. It is thus desirable to form fast transistors with less loss. To achieve this, transistors having an intermediary gate insulator thickness may be selected.

SUMMARY OF THE INVENTION

An embodiment provides a method for manufacturing, on the same substrate, three types of MOS transistors which differ by the thickness of their gate insulator. This manufacturing method is compatible with manufacturing technologies providing MOS transistors having a minimum dimension smaller than 35 nm.

Another embodiment provides a manufacturing method compatible with methods for manufacturing MOS transistors having a gate insulator comprising an oxide and a material of high dielectric constant.

Another embodiment provides a simple and inexpensive manufacturing method.

Thus, an embodiment provides a method for manufacturing three types of MOS transistors in three regions of a same substrate, comprising the successive steps of forming a first insulating layer, removing the first insulating layer from the first and second regions, forming a silicon oxide layer, depositing an insulating layer having a dielectric constant which is at least twice greater than that of silicon oxide, depositing a first conductive oxygen scavenging layer, removing the first conductive layer from the second and third regions, and annealing.

According to an embodiment, the method further comprises the steps of removing the first conductive layer and forming a second conductive layer.

According to an embodiment, the method further comprises, after or before anneal, the forming of a second conductive layer.

According to an embodiment, the first insulating layer is an oxide.

According to an embodiment, the method further comprises a step of deposition of conductive polysilicon.

According to an embodiment, the insulating layer having a dielectric constant at least twice greater than that of silicon oxide is made of hafnium oxide.

According to an embodiment, the material of the first conductive layer is selected from the group comprising substoichiometric titanium nitride and aluminum.

According to an embodiment, the material of the second conductive layer is selected from the group comprising titanium nitride and tantalum nitride, both superstoichiometric.

The foregoing and other objects, features, and advantages will be discussed in detail in the following non-limiting description of specific embodiments in connection with the accompanying drawings.

DETAILED DESCRIPTION

Figure 1:
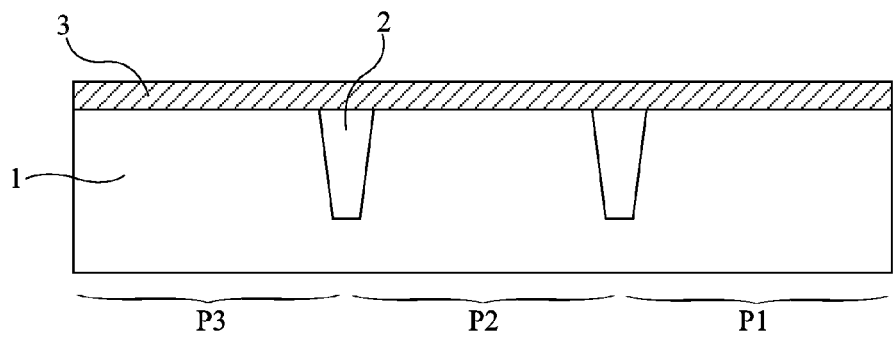
FIGS. 1 to 9 are partial cross-section views illustrating successive steps of an example of a method for manufacturing, on the same substrate, three types of MOS transistors which differ by the thickness of their gate insulator.

For clarity, the same elements have been designated with the same reference numerals in the different drawings and, further, as usual in the representation of integrated circuits, the various drawings are not to scale.

FIG. 1 is a partial cross-section view illustrating an initial step of a method for manufacturing MOS transistor gates on a single-crystal silicon substrate 1. Three regions P1, P2, and P3 of substrate 1 in which three different types of MOS transistors will be formed by the described method have been shown. In the shown example, these three regions are separated by trenches 2 filled with an insulator, for example, silicon oxide. An insulating layer 3, preferably made of silicon oxide, is formed on this structure. The material forming insulating layer 3 may be any material capable of being used as a gate insulator in MOS transistors. Insulating layer 3 may be formed by thermal oxidation or chemical vapor deposition (CVD). The thickness of insulating layer 3 for example ranges between 2 and 3 nm.

Figure 2:
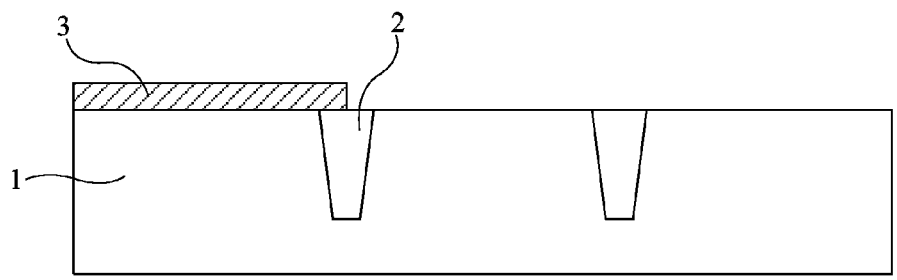

At the step illustrated in FIG. 2, insulating layer 3 is etched to be removed from regions P1 and P2 and is only left in region P3. The etching may be carried out by using a liquid chemical (wet etching) or with a plasma (dry etching).

Figure 3:
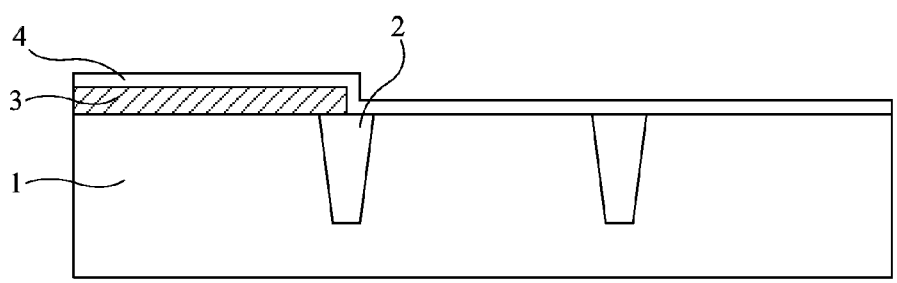

At the step illustrated in FIG. 3, a silicon oxide layer 4 is formed on the upper surface of regions P1, P2, and P3 of the structure of FIG. 2. The silicon oxide is formed by thermal oxidation or chemical vapor deposition. The thickness of layer 4 ranges between 0.7 and 1.5 nm.

Figure 4:
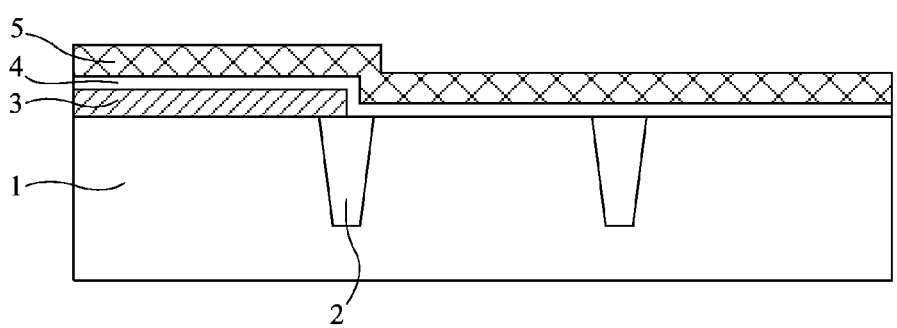

At the step illustrated in FIG. 4, an insulating layer 5 having a dielectric constant which is at least twice greater than that of silicon oxide is formed on the upper surface of regions P1, P2, and P3 of the structure of FIG. 3. Insulating layer 5 is preferably made of hafnium oxide having a dielectric constant of 30 (that is, more than seven times that of silicon oxide). Insulating layer 5 may be made of hafnium oxide, of zirconium oxide, or more generally of any material having a dielectric constant at least twice greater than that of silicon oxide and capable of being used as a gate insulator. Insulating layer 5 may be deposited by chemical vapor deposition. Its thickness ranges between 1.5 and 2.5 nm.

Figure 5:
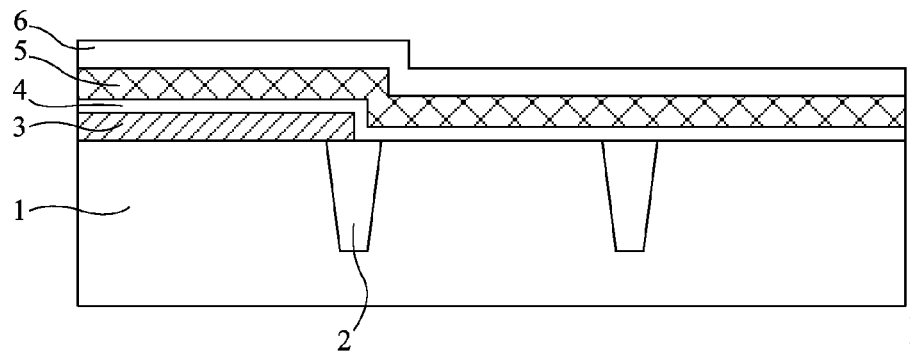

At the step illustrated in FIG. 5, a layer of a conductive oxygen scavenging material 6 is deposited on the upper surface of regions P1, P2, and P3 of the structure of FIG. 4. The material forming layer 6 has the ability to capture and fix oxygen. Layer 6 is for example made of substoichiometric titanium nitride (titanium-rich), or of aluminum. It is deposited by chemical vapor deposition or by physical vapor deposition. The thickness of layer 6 is greater than 3 nm.

Figure 6:
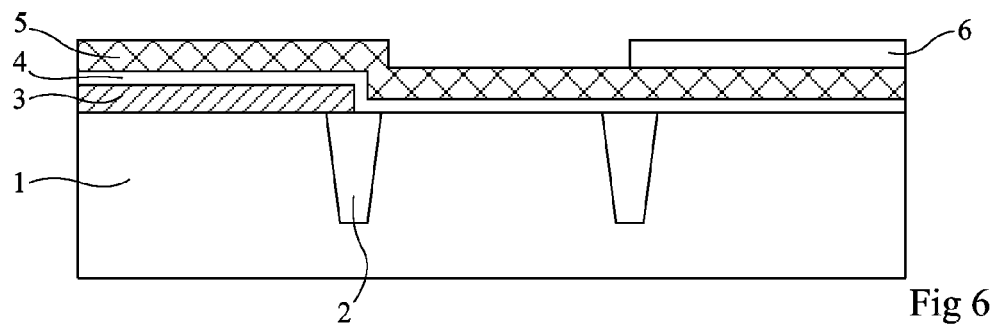

At the step illustrated in FIG. 6, conductive oxygen scavenging layer 6 is etched to be removed from regions P2 and P3 and left in region P1. The etching may be carried out by using a liquid chemical (wet etching) or with a plasma (dry etching).

Figure 7:
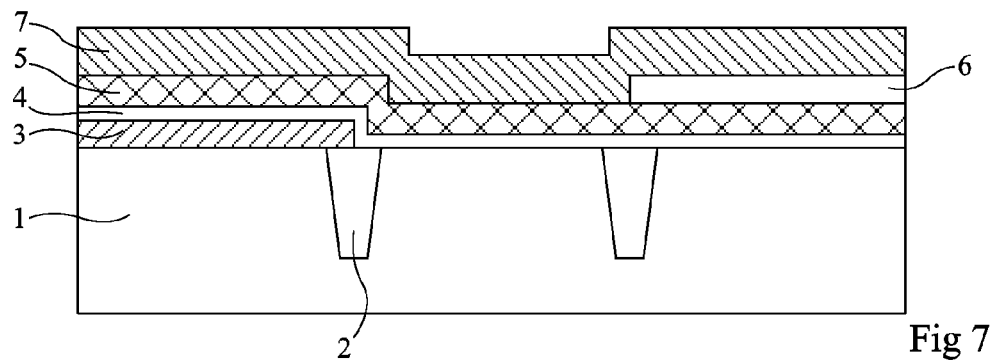

At the step illustrated in FIG. 7, a second conductive layer 7 is deposited over the upper surface of regions P1, P2, and P3. Layer 7 may be made of superstoichiometric titanium or tantalum nitride (nitrogen-rich), that is, of a conductive material which can be very difficult to oxidize. The thickness of layer 7 is greater than 3 nm.

Figure 8:
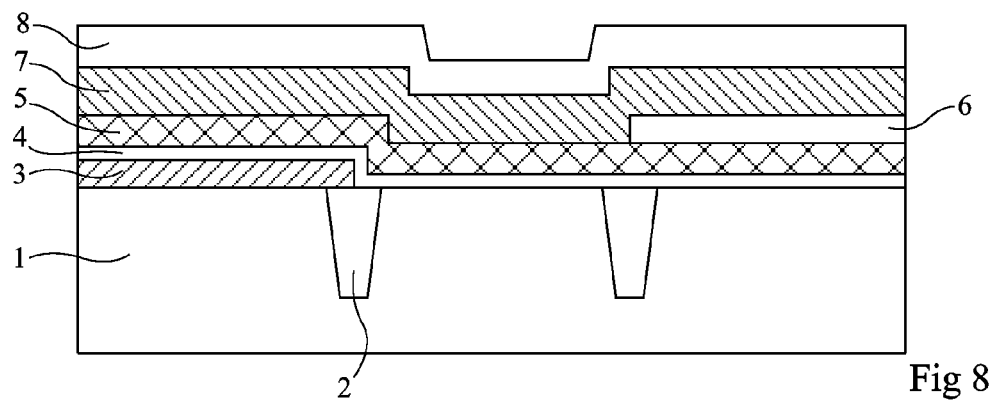

At the step illustrated in FIG. 8, a conductive polysilicon layer 8 is deposited on the upper surface of regions P1, P2, and P3 of the structure of FIG. 7. The thickness of layer 8 is greater than 30 nm.

Figure 9:
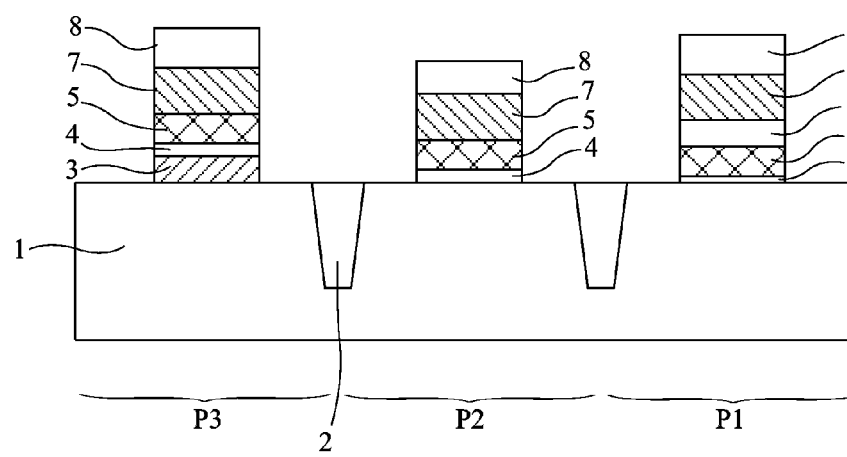

At the step illustrated in FIG. 9, the stack of the layers formed on substrate 1 is etched to define three insulated gates, respectively in the three regions P1, P2, and P3. The lateral dimensions of the gates in regions P1, P2, and P3 are selected according to the desired characteristics of the transistors in each of the regions. The etching may be carried out by using a liquid chemical (wet etching) or with a plasma (dry etching).

An anneal is carried out at a step subsequent to the step of deposition of second conductive layer 7. It should be noted that this anneal may be integrated with other anneals provided to form the transistors.

During the anneal, in region P1, the oxygen of silicon oxide layer 4 diffuses through insulating layer 5 all the way to conductive oxygen scavenging layer 6. The material forming layer 6 oxidizes. Under the effect of temperature, the silicon corresponding to silicon oxide having lost oxygen atoms crystallizes according to the mesh imposed by underlying single-crystal silicon substrate 1. Thus, the thickness of silicon oxide layer 4 decreases to form a silicon oxide layer 9 of lower thickness. If the thickness of silicon oxide layer 4 ranges between 0.7 and 1.5 nm, the thickness of layer 9 may range between 0 and 0.8 nm.

Current MOS transistor manufacturing steps and especially the forming of source and drain regions and the forming of interconnection metal levels are then carried out.

The above method enables to form transistor gates having three different thicknesses. In region P3, the gate insulator of the transistor is formed of insulating layer 3, silicon oxide layer 4, and insulating layer 5. In region P2, the gate insulator is formed of silicon oxide layer 4 and of insulating layer 5. In region P1, the gate insulator is formed of silicon oxide layer 9 and of insulating layer 5.

The manufacturing process illustrated in FIGS. 1 to 9 enables to form, on the same substrate, three types of MOS transistors which differ by the thickness of their gate insulator. It thus becomes possible to form, on a same substrate, power MOS transistors, low-power consumption MOS transistors, and high-speed MOS transistors.

This manufacturing process is compatible with MOS transistor manufacturing processes having a gate length shorter than 35 nm, since it induces no size limitation for the gate length of MOS transistors.

Further, this method is compatible with methods for manufacturing transistors with a gate insulator formed of an oxide and of a material having a high dielectric constant. Indeed, as discussed previously, the silicon oxide layer thinning phenomenon is possible since the oxygen can diffuse through the material of high dielectric constant all the way to the conductive scavenging layer. In region P1, the equivalent gate insulator thickness may be smaller than 0.6 nm, if the thickness of final silicon oxide layer 9 is 0.4 nm and the material of high dielectric constant is hafnium oxide having a thickness on the order of 1.5 nm.

This manufacturing method is simple to implement since it only uses:

technological steps tried and tested in microelectronics, materials widely used in industrial manufacturing methods, two photolithography and etch steps requiring a much lower resolution than the photolithography and the etching defining the dimension of the gate length of MOS transistors.

Specific embodiments have been described. Various alterations and modifications will occur to those skilled in the art. In particular, the substrate may be a solid single-crystal silicon substrate or again a so-called SOI single-crystal silicon layer on an insulator (Silicon-On-Insulator).

Figure 10:
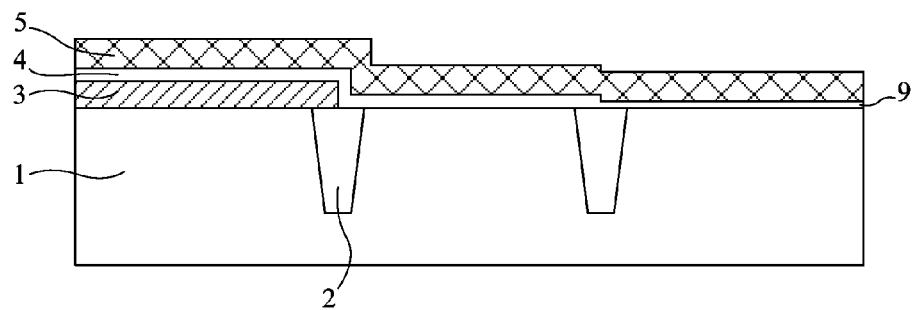
FIG. 10 illustrates a step of an alternative manufacturing method.

According to an alternative embodiment, after the step illustrated in FIG. 6, an anneal is performed to implement the above-described properties of conductive scavenging layer 6. After this, layer 6 is etched to be removed. The structures illustrated in FIG. 10 are thus obtained. The steps described in relation with FIGS. 7 to 9 are then carried out:

deposition of conductive layer 7, deposition of polysilicon 8, and definition of the gates.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing three MOS transistors in three regions of a substrate, the three regions comprising a first region, a second region and a third region, the method comprising acts of:

forming a first insulating layer in the first region, the second region and the third region, removing the first insulating layer from the first and second regions, forming a silicon oxide layer in the first region, the second region and the third region, depositing a second insulating layer in the first region, the second region and the third region, wherein the second insulating layer has a dielectric constant which is at least twice greater than that of silicon oxide, depositing a first conductive oxygen scavenging layer in the first region, the second region and the third region, completely removing the first conductive oxygen scavenging layer from the second and third regions, and annealing.

2. The method of claim 1, further comprising an act of:

forming a second conductive layer in the first region, the second region and the third region after the act of annealing.

3. The method of claim 2, wherein the second conductive layer comprises superstoichiometric titanium nitride and/or superstoichiometric tantalum nitride.

4. The method of claim 2, wherein the second conductive layer is in direct contact with the second insulating layer in at least the second region.

5. The method of claim 4, further comprising an act of:
completely removing the first conductive oxygen scavenging layer from the first region after the act of annealing and before the act of forming the second conductive layer.

6. The method of claim 2, wherein the second conductive layer is in direct contact with the second insulating layer in the first region.

7. The method of claim 1, further comprising an act of:
forming of a second conductive layer in the first region, the second region and the third region before the act of annealing.

8. The method of claim 1, wherein the first insulating layer is an oxide.

9. The method of claim 1, further comprising an act of:
depositing conductive polysilicon in the first region, the second region and the third region.

10. The method of claim 1, wherein the second insulating layer having a dielectric constant at least twice greater than that of silicon oxide comprises hafnium oxide.

11. The method of claim 1, wherein the first conductive oxygen scavenging layer comprises substoichiometric titanium nitride and/or aluminum.

12. The method of claim 1, wherein, after the act of annealing, a thickness of the silicon oxide layer in the first region is less than a thickness of the silicon oxide layer in the second region.

13. The method of claim 12, wherein, after the act of annealing, the thickness of the silicon oxide layer in the first region is less than 0.8 nm.

* * * * *